United States Patent
Kruijswijk et al.

(10) Patent No.: US 7,679,715 B2
(45) Date of Patent: *Mar. 16, 2010

(54) LITHOGRAPHIC PROCESSING CELL, LITHOGRAPHIC APPARATUS, TRACK AND DEVICE MANUFACTURING METHOD

(75) Inventors: Stefan Geerte Kruijswijk, Eindhoven (NL); Rard Willem De Leeuw, Eindhoven (NL); Paul Frank Luehrmann, Santa Fe, NM (US); Wim Tjibbo Tel, Helmond (NL); Paul Jacques Van Wijnen, Veldhoven (NL); Kars Zeger Troost, Waalre (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 12/213,355

(22) Filed: Jun. 18, 2008

(65) Prior Publication Data

US 2008/0266538 A1 Oct. 30, 2008

Related U.S. Application Data

(63) Continuation of application No. 10/964,815, filed on Oct. 15, 2004, now Pat. No. 7,403,259.

(30) Foreign Application Priority Data

Oct. 17, 2003 (EP) ................... 03256573

(51) Int. Cl.
- *G03B 27/32* (2006.01)
- *G03B 27/42* (2006.01)
- *G03D 5/00* (2006.01)
- *G01R 31/26* (2006.01)
- *G06F 19/00* (2006.01)

(52) U.S. Cl. .............. 355/27; 355/53; 438/14; 438/16; 700/121

(58) Field of Classification Search .......... 355/27, 355/53; 396/611; 700/121; 438/12, 14, 438/16; 378/34; 118/719
See application file for complete search history.

(56) References Cited

U.S. PATENT DOCUMENTS

| | | | |
|---|---|---|---|
| 6,210,846 B1 | 4/2001 | Rangarajan et al. |
| 6,466,300 B1 | 10/2002 | Deguchi |
| 6,740,534 B1 | 5/2004 | Adams et al. |
| 7,033,903 B2 | 4/2006 | Lin et al. |

(Continued)

FOREIGN PATENT DOCUMENTS

JP 62-162535 A 7/1987

(Continued)

OTHER PUBLICATIONS

Notice of Reasons for Rejection dated Jan. 30, 2008 for Japanese Patent Application No. 2004-329761.

(Continued)

*Primary Examiner*—Alan A Mathews
(74) *Attorney, Agent, or Firm*—Pillsbury Winthrop Shaw Pittman LLP

(57) ABSTRACT

A rework station and a metrology device(s) are incorporated into a lithographic processing cell so that a faulty substrate can be reworked directly and reprocessed without, for example, an overhead involved in changing masks, etc.

22 Claims, 3 Drawing Sheets

U.S. PATENT DOCUMENTS

| | | | |
|---|---|---|---|
| 7,403,259 B2 * | 7/2008 | Kruijswijk et al. | 355/27 |
| 2002/0081758 A1 | 6/2002 | Iriki | |
| 2003/0155077 A1 | 8/2003 | Hisai et al. | |
| 2003/0169411 A1 | 9/2003 | Ota | |
| 2004/0029025 A1 | 2/2004 | Hommen et al. | |
| 2004/0102857 A1 | 5/2004 | Markle et al. | |

FOREIGN PATENT DOCUMENTS

| | | |
|---|---|---|
| JP | 5-21307 A | 1/1993 |
| JP | 2000-16756 A | 1/2000 |
| JP | 2001-15408 A | 1/2001 |
| JP | 2002-198289 A | 7/2002 |
| JP | 2003-243295 A | 8/2003 |

OTHER PUBLICATIONS

Hickman, et al., "Use of Diffracted Light from Latent Images to Improve Lithography Control," SPIE vol. 1464, Integrated Circuit Metrology, Inspection, and Process Control V, (1991), pp. 245-257.

Przybyla J., et al., "A Fully Integrated Photolithography Workcell", International Semiconductor Manufacturing Science Symposium, May 1989, pp. 100-107.

European Search Report for European Application No. 03 25 6573, dated Jun. 28, 2004.

* cited by examiner

LITHOGRAPHIC PROCESSING CELL, LITHOGRAPHIC APPARATUS, TRACK AND DEVICE MANUFACTURING METHOD

This is a continuation of U.S. patent application Ser. No. 10/964,815, filed Oct. 15, 2004 now U.S. Pat. No. 7,403,259, which application claims priority from European patent application EP 03256573.1, filed Oct. 17, 2003, each of the foregoing applications incorporated herein in its entirety by reference.

FIELD

The present invention relates to a lithographic processing cell, a lithographic apparatus for use with a track in a lithographic processing cell, a track for use with a lithographic apparatus in a lithographic processing cell and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In a factory, commonly referred to as a "fab" or "foundry", in which semiconductor or other devices are manufactured, each lithographic apparatus is commonly grouped with a "track" comprising substrate handling devices and pre- and post-processing devices to form a lithographic processing cell commonly referred to as "lithocell". Substrates (e.g., wafers), which may be blank or have already been processed to include one or more process or device layers, are delivered to the lithocell in lots (also referred to as batches) for processing. A lot is, in general, a group of substrates which are to processed by the lithocell in the same way and is accompanied by a "recipe" which specifies the processes to be carried out. The lot size may be arbitrary or determined by the size of carrier used to transport substrates around the fab. The recipe may include details of the resist coating to be applied, temperature and duration of pre- and post-exposure bakes, details of the pattern to be exposed and the exposure settings for that, development duration, etc.

Inevitably, errors occur in the processing of substrates, e.g. focus spots caused by dust on the substrate table and overlay errors, and various measurement techniques, collectively referred to as metrology, for detecting them are known. If an error can be detected before an irreversible process step, e.g. an etch, has been carried out, the developed resist may be stripped from the substrate and the substrate reprocessed with the aim of producing a correct layer. Existing metrology devices are generally off-line, that is stand alone devices outside the lithocell to which exposed substrates are taken to be measured. The measurement processes may be time consuming, so that often only a sample of the substrates in a lot are measured and in the event that errors are detected the whole lot is stripped and reprocessed. This can be inefficient in that many perfectly good substrates may be reprocessed and ineffective in that the sampling of substrates may not detect a few bad substrates in a lot.

SUMMARY

With the development of faster measurement techniques, metrology devices may included in the lithocell ("integrated metrology") to measure all substrates. Then, all the actually faulty substrates can be detected and separated from the good substrates of the lot for reprocessing, avoiding unnecessary reprocessing and preventing faulty substrates escaping detection.

Accordingly, it would be advantageous, for example, to provide a lithographic processing cell, lithographic apparatus, track and device manufacturing method in which faulty substrates can be reprocessed more efficiently and/or more rapidly.

According to an aspect of the invention, there is provided a lithographic processing cell, comprising:

a lithographic apparatus configured to expose a substrate with a pattern;

a track comprising one or more processing devices configured to process a substrate;

a rework station configured to rework a substrate during the exposure or processing of one or more substrates; and a supervisory control system configured to control the lithographic apparatus and the track, the supervisory control system configured to control the rework station to rework a substrate for which an unusual occurrence was detected during exposure, processing, or both, of the substrate.

Reworking triggered by an unusual occurrence detected by the lithographic apparatus or track may include an out of specification movement during scanning, a focus spot detected by a focus/level sensor and/or a partial system failure during exposure and/or processing. An unusual occurrence may leave an error on the exposed and/or processed substrate such the faulty substrate may be out of specification and need reworking. Optionally or additionally, an error on the exposed and/or processed substrate may be confirmed by a metrology device before reworking is started. Triggering a reworking or a metrology check upon an unusual occurrence may increase the efficiency by which a lithographic processing cell can be employed. For example, a faulty substrate detected early in the processing of a lot can be stripped, while other substrates of the lot are being processed, and then automatically reprocessed directly after initial processing of the substrates of the lot. This may avoid a delay that would be incurred by separating the faulty substrate from the correctly processed substrates, taking it to a separate stripping (rework) station and returning it to the lithocell for reprocessing, steps which typically have been carried out manually. The additional overhead of loading the new lot comprising the stripped substrate into the lithocell and exchanging masks and recipe data in the lithographic apparatus can be eliminated.

Furthermore, by carrying out reworking sooner after the faulty exposure and/or processing, there is less time for the resist to harden, so the rework may be easier and less aggressive, and there is less time for the resist to react with an earlier process layer avoiding damage to a delicate earlier layer.

During reprocessing of the reworked substrate, one or more correctly processed substrates can be held in an output port of the track so that the reprocessed substrate can be merged back into the lot for subsequent treatment together, avoiding having to manually reassemble the lot and avoiding the delay and inefficiency caused by processing two smaller lots.

In an embodiment, a new lot is created for the reworked substrate and the new lot may be processed directly after the lot from which the reworked substrate derives or later in a sequence of lots (e.g., if more convenient).

If a series of lots are being processed using a same recipe, two further options are possible. Either the reworked substrate may be added to a later lot, e.g. at the beginning, or reworked substrates from several different lots may be gathered together to form a new lot.

The metrology device may be a separate device within the track to which one or more substrates are transported by the substrate handler or may be incorporated in the lithographic apparatus.

The rework station may comprise a wet chemical device including a dispenser configured to dispense a solvent, a rinse, or both, onto the substrate. Optionally, the rework station may comprise a turntable configured to spin the substrate to remove material by centripetal action. The rework station may include a mechanical polisher.

In an embodiment, the rework station may be a developer configured to be controlled by the supervisory control system to overdevelop the resist. The substrate may be reworked, for example, by using a flood exposure prior to development if a positive resist is used.

According to a further aspect of the invention, there is provided a lithographic apparatus for use with a track, having a track control unit, in a lithographic processing cell, comprising:

an illuminator configured to condition a beam of radiation;

a support structure configured to hold a patterning device, the patterning device configured to impart the beam of radiation with a pattern in its cross-section;

a substrate table configured to hold a substrate; and a projection system configured to project the patterned beam onto a target portion of the substrate; and a lithographic apparatus control system with an interface configured to communicate with the track control unit of the track, the lithographic apparatus control system configured to report an unusual occurrence during exposure of a substrate in the lithographic apparatus to the track control unit via the interface.

According to a further aspect of the invention, there is provided a track for use with a lithographic apparatus in a lithographic processing cell, comprising:

one or more processing devices configured to process one or more substrates;

a rework station configured to rework a substrate; and a track control unit provided with an interface configured to communicate with a lithographic apparatus control system of the lithographic apparatus, the track control unit configured to control the rework station to rework a substrate for which an unusual occurrence was detected during the exposure in the lithographic apparatus, during the processing in the track, or both.

According to another aspect of the invention, there is provided a device manufacturing method, comprising:

exposing a substrate of a lot, the lot comprising a plurality of substrates, to a pattern using a lithographic projection apparatus in a lithographic processing cell, processing the substrate using a track in the lithographic processing cell, or both;

detecting an unusual occurrence during exposing, processing, or both, of the substrate in the lithographic processing cell;

stripping resist from the exposed substrate using a rework station in the lithographic processing cell if an unusual occurrence has been detected for the substrate;

re-coating with resist the stripped substrate; and re-exposing the re-coated substrate using the lithographic apparatus without the re-coated substrate leaving the lithographic processing cell.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
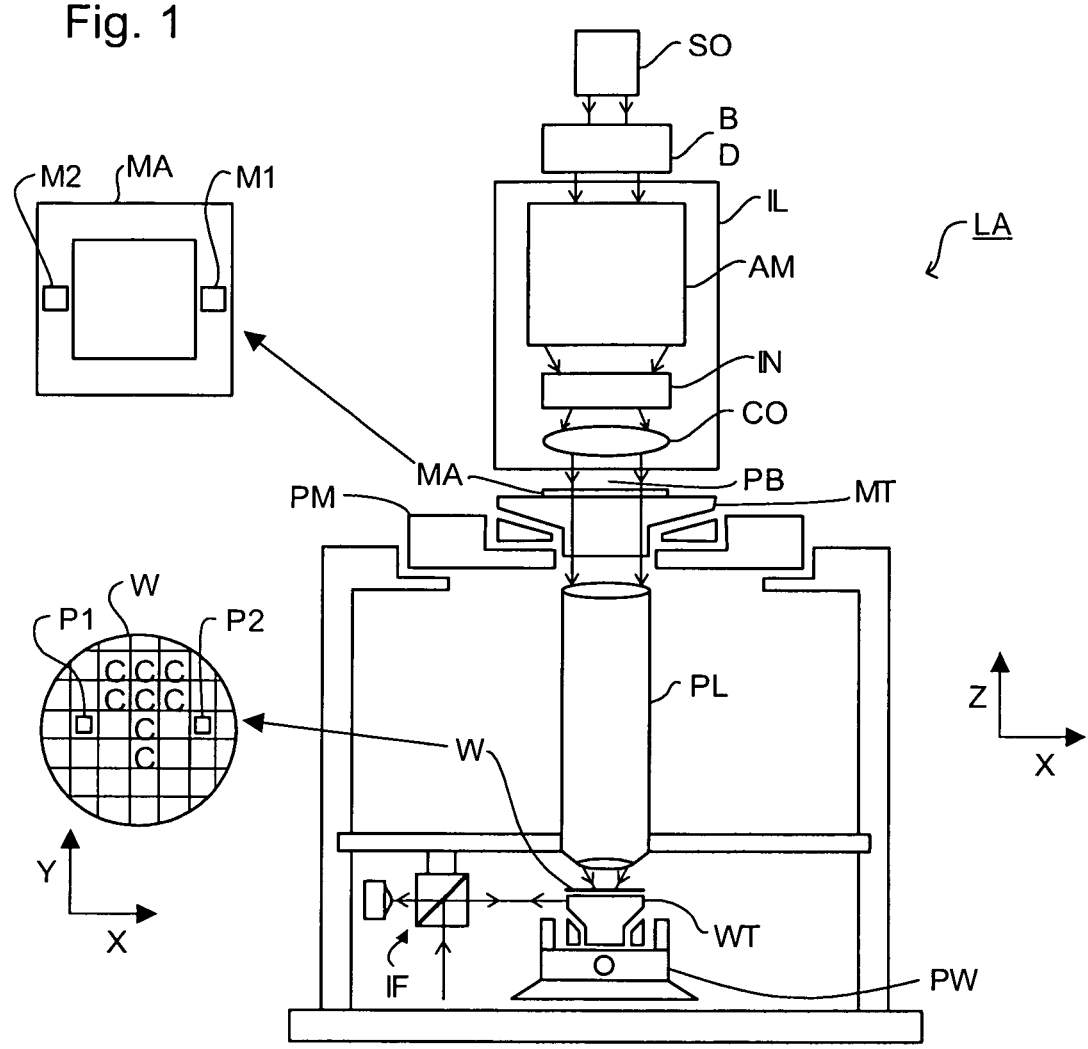
FIG. 1 depicts a lithographic apparatus according to an embodiment of the invention.

FIG. 1 schematically depicts a lithographic apparatus which may form part of an embodiment of the invention. The apparatus comprises:

an illumination system (illuminator) IL configured to provide a projection beam PB of radiation (e.g. UV radiation or DUV radiation);

a first support structure (e.g. a mask table) MT configured to hold a patterning device (e.g. a mask) MA and connected to a first positioning device PM configured to accurately position the patterning device with respect to item PL;

a substrate table (e.g. a wafer table) WT configured to hold a substrate (e.g. a resist-coated wafer) W and connected to a second positioning device PW configured to accurately position the substrate with respect to item PL; and a projection system (e.g. a refractive projection lens) PL configured to image a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
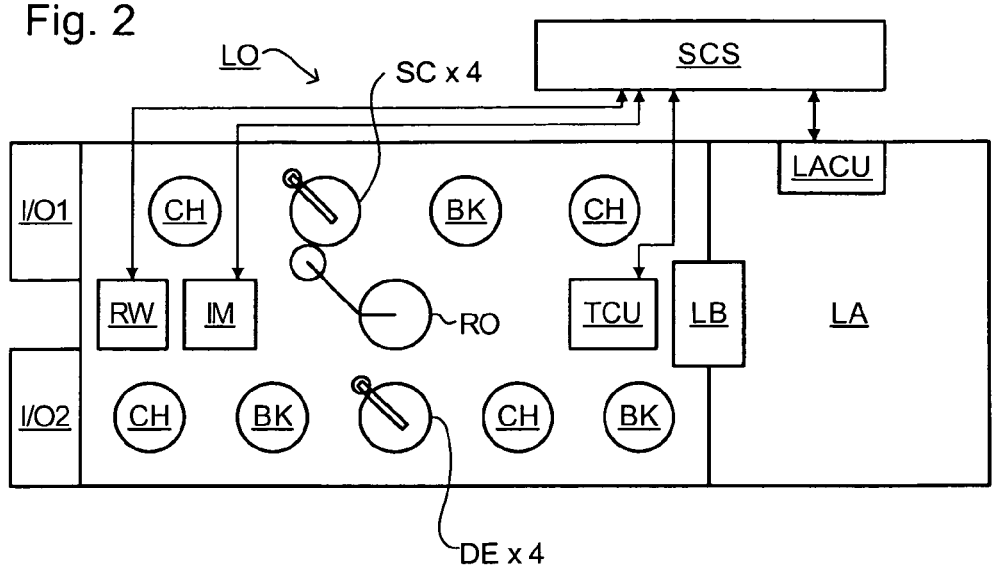
FIG. 2 depicts a lithographic processing cell according to an embodiment of the invention.

The lithographic apparatus LA shown in FIG. 1, forms part of the lithographic processing cell, or lithocell, LO shown in FIG. 2. The lithocell LO is further provided with a track which may include the following devices: input/output ports I/O1 and I/O2 (a single port or more than two may also be provided), chiller plates CH configured to cool substrates, bake plates BK configured to heat substrates, spin coaters SC (typically four) configured to coat substrates, e.g., with resist, developers DE (again typically four) and a substrate handler, or robot, RO configured to move substrates between the various devices and the loading bay LB of the lithographic apparatus LA. The aforementioned devices are generally referred to collectively as the track and are controlled by a track control unit TCU so as to process substrates according to the appropriate recipe. Typically, substrates are taken in at one of the ports I/O1 or I/O2, cooled on a chiller plate CH, coated with resist using a spin coater SC, given a pre-exposure bake on a bake plate BK to drive off excess solvent in the resist and cooled again before being exposed by the lithographic apparatus LA. After exposure, the substrates are subjected to a soft bake on a bake plate BK, cooled on a chiller plate CH, developed at developer DE, hard baked on a bake plate BK and cooled again on a chiller plate CH before being output via one of the ports I/O1 or I/O2.

In a lithocell according to an embodiment of the invention, the conventional devices in the track may be supplemented by one or more integrated metrology devices IM and one or more rework stations RW. The integrated metrology device IM may be an overlay measurement tool of known type, such as a scatterometer, a scanning electron microscope, etc., that can be used to detect errors or faults in exposed substrates. The metrology device may measure the developed resist image or the latent resist image if there is sufficient contrast. Any metrology devices built into the lithographic apparatus LA, such as an off-axis alignment tool or level sensor, may also be used instead of or in conjunction with the integrated metrology device included in the track. The rework station RW is a device configured to strip the resist from substrates and may be similar in form to a spin coater or a developer. The rework station may also include a flood exposer configured to expose substrates without a pattern and a mechanical or chemo-mechanical polisher. It is also possible to use multi-purpose devices capable of selectively dispensing a number of different liquids, e.g. resist, developer, solvent, rinse, etc., in place of a separate, dedicated spin coater, developer and/or rework station.

The track, lithographic apparatus LA, metrology device IM and rework station RW may be controlled by a supervisory control system, SCS, which supervises the lithographic apparatus control system LACU and the track control unit TCU and, in an embodiment, conforms to SECS standards.

Figure 3:
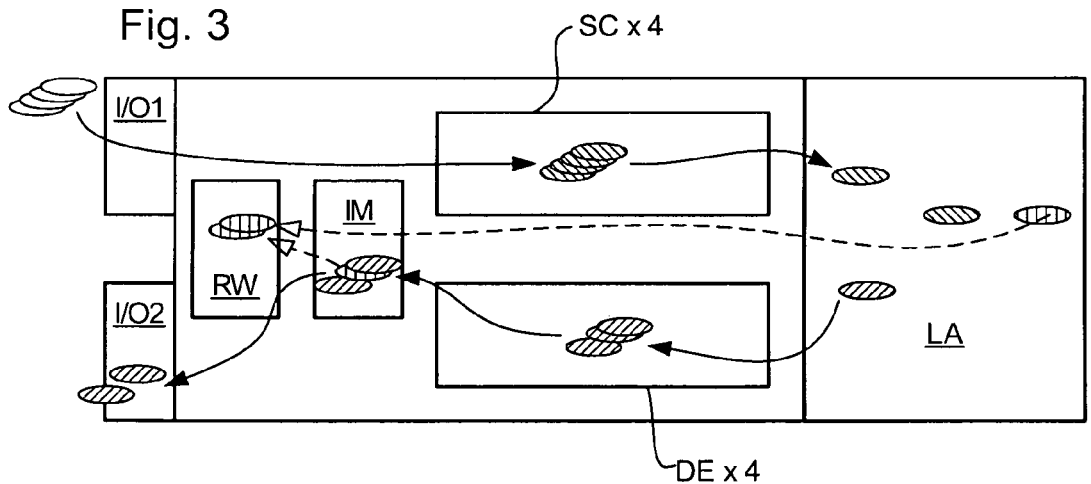
FIGS. 3 and 4 are simplified drawings of the lithographic processing cell showing the progress of substrates through the cell in a method according an embodiment of the invention.
Figure 4:
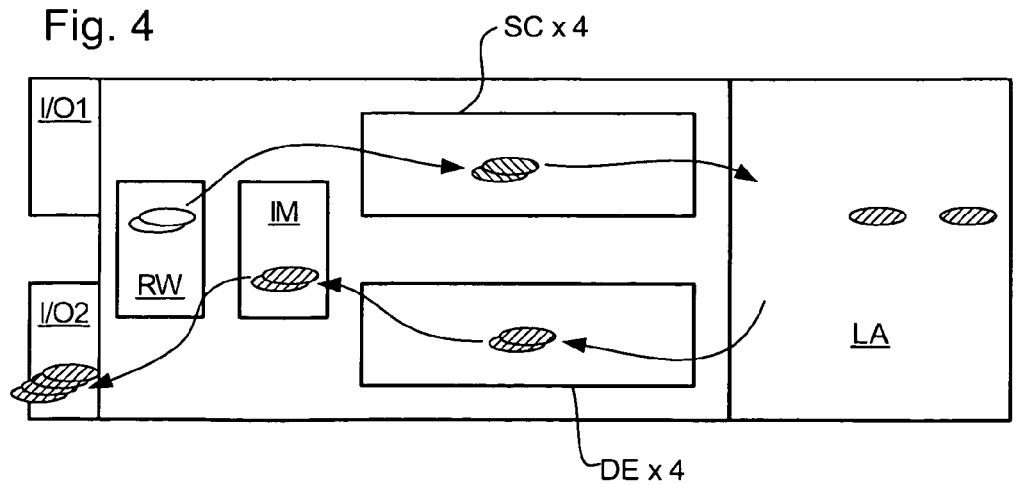
Figure 5:
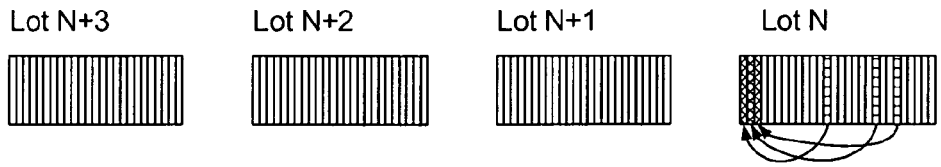
FIGS. 5 to 9 illustrate substrate processing sequences in variants of an embodiment of the method of the invention.

FIGS. 3 and 4 illustrate a manufacturing process according to an embodiment of the invention. As shown in FIG. 3 (which omits some steps for clarity such as baking and cooling), a lot is loaded via input/output port I/O1, then the substrates are coated by spin coaters SC, exposed by lithographic apparatus LA and developed by developers DE. Some or all of the developed substrates may be measured or inspected by the integrated metrology IM and one or more substrates that pass are sent to input/output port I/O2 where the processed lot is assembled before transfer to another process. One or more substrates that fail inspection, e.g., because one or more faults are detected, are diverted to rework station RW.

If an unusual occurrence is detected during exposure or processing, for example a focus spot, a system failure or an out-of-spec dynamic performance, a substrate may be diverted directly to the rework station RW, bypassing development and inspection/fault detection. A focus spot is generally caused by a foreign particle between the substrate and the topside of the substrate table on which the substrate is clamped. The foreign particle makes the surface contour of the substrate show a certain unevenness that deteriorates exposure on the surface. The focus/level sensor measures the surface contour of the substrate to keep the surface in focus of the projection system. If the focus/level sensor detects a surface contour with a certain unevenness which is out of specification, this will lead to an exposure error (focus spot) at that location. The focus/level sensor and the lithographic apparatus control system may report the unusual occurrence to the supervisory control system so that the substrate may be reworked and exposed again.

In the second phase, the one or more substrates that were determined to be faulty and that have been stripped of resist in the rework station are reprocessed, that is coated, exposed, developed and inspected. Assuming the reworked and reprocessed one or more substrates pass inspection the second time, these one or more substrates are reunited with the remainder of the lot in input/output port I/O2. One or more substrates that fail inspection after reprocessing may be reprocessed a second time or rejected (particularly if the same fault recurs).

Variations on the sequence of processing and reprocessing substrates according to an embodiment of the method of the invention are possible, as shown in FIGS. 5 to 9. In the basic method shown in FIG. 5, lots N, N+1, N+2, etc. are processed in sequence and one or more faulty substrates (shown with horizontal hatching) are reprocessed at the end of the lot from which they derive. This may simplify downstream processing and may be most efficient if the stripping of resist can be performed quickly enough such that there is no delay before the stripped one or more substrates can be reprocessed.

Figure 6:
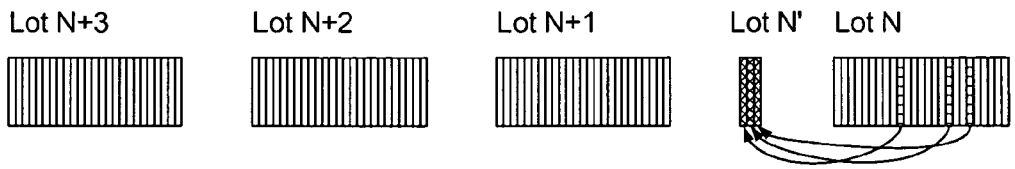

If the reworked one or more substrates require some special treatment thereafter, perhaps an adjustment to an exposure or processing parameter to compensate for whatever caused the error in the first place, the reworked one or more substrates can be separated from their original lot, lot N, and form a new lot N' which is then processed directly after lot N to reduce or minimize the overhead time required to load a mask (or mask data) into the lithographic apparatus LA and otherwise prepare the track for the required process. This is shown in FIG. 6. Processing the reworked one or more substrates as a separate lot may also be desirable for quality control reasons.

Figure 7:
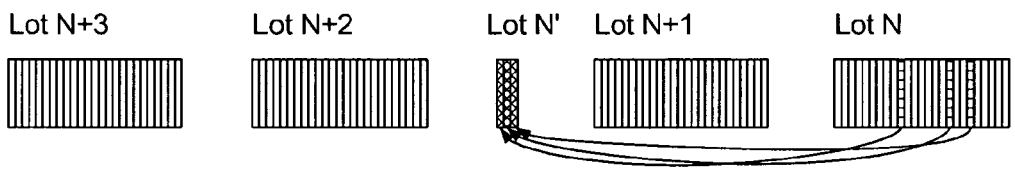
Figure 8:
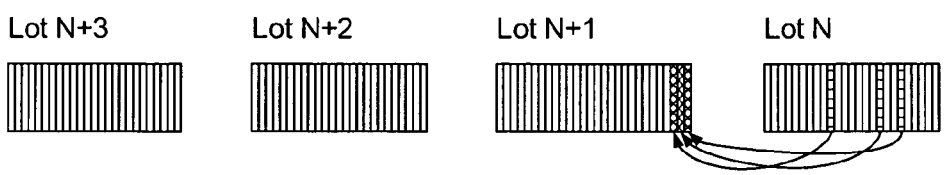
Figure 9:
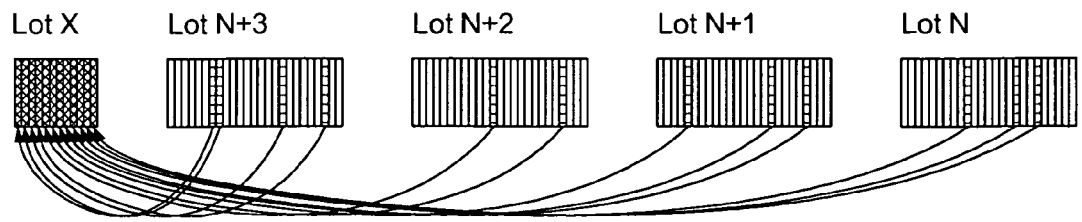

FIG. 7 shows the situation when the reworked one or more substrates are processed as new lot N', after lot N+1. This may avoid delay if the stripping process takes a substantial period of time but may cause additional delay due to the need to reload one or more masks unless lot N+1 uses the same mask as lot N. In the latter case, and if the same recipe in total is to be applied, the reworked one or more substrates from lot N may be added to lot N+1, at any point, not just at the beginning as shown in FIG. 8. If a sequence of lots, lots N to N+3 for example, are processed with the same recipe, the reworked one or more substrates from all of the lots may be gathered into a new lot, lot X, as shown in FIG. 9.

While specific embodiments of the invention have been described above, it will be appreciated that the invention may be practiced otherwise than as described. The description is not intended to limit the invention.

The invention claimed is:

1. A lithographic processing cell, comprising:
   a lithographic apparatus configured to expose a substrate with a pattern;
   a track comprising one or more processing devices configured to process a substrate and a metrology station;
   a rework station configured to rework a substrate during the exposure, processing, or both, of one or more substrates; and
   a supervisory control system configured to control the lithographic apparatus and the track, the supervisory control system configured to control the rework station to rework a substrate based on a measurement or fault detected other than at the metrology station of the track.

2. The cell according to claim 1, wherein the rework station comprises a wet chemical device including a dispenser configured to dispense a solvent, a rinse, or both, onto the substrate.

3. The cell according to claim 1, wherein the rework station comprises a mechanical polisher.

4. The cell according to claim 1, wherein the rework station comprises a developer that is configured to be controlled by the supervisory control system to overdevelop the resist.

5. The cell according to claim 1, further comprising a metrology device configured to detect one or more faults in a substrate processed by the lithographic processing cell.

6. The cell according to claim 1, wherein the lithographic apparatus comprises:
   a support structure configured to hold a patterning device, the patterning device configured to impart a beam of radiation with a pattern in its cross-section;
   a substrate table configured to hold a substrate; and
   a trajectory controller configured to control a movement of the substrate table, the patterning device, or both, to follow a trajectory and configured to report a fault to control rework if the movement of the substrate table, the patterning device, or both, deviates significantly from the trajectory.

7. The cell according to claim 1, wherein the lithographic apparatus comprises:
   a substrate table configured to hold a substrate;
   a projection system configured to project a patterned beam onto a target portion of the substrate; and
   a focus/level sensor configured to measure a surface contour of the substrate and configured to report a measurement to control rework if the surface contour exceeds a certain unevenness.

8. The cell according to claim 1, wherein the supervisory control system is configured to hold, in the cell, one or more correctly processed sub states of a lot comprising the substrate for which the measurement or detected fault to control rework was made and to merge the substrate for which the measurement or detected fault to control rework was made back into the lot, after being reworked, for subsequent treatment together with the one or more correctly processed substrates.

9. The cell according to claim 1, wherein the supervisory control system is configured to create a new lot for the substrate for which the measurement or detected fault to control rework was made and to process the new lot directly after a lot from which that substrate derives or later in a sequence of lots.

10. The cell according to claim 1, wherein a plurality of lots are exposed and processed using a same recipe and wherein the supervisory control system is configured to combine the substrate for which the measurement or detected fault to control rework was made, that substrate deriving from a lot of the plurality of lots, with one or more substrates, either reworked or not, from another of the plurality of lots to form a new lot.

11. A lithographic apparatus for use with a track, the track having a track control unit and a metrology station, the lithographic apparatus comprising:
    a support structure configured to hold a patterning device, the patterning device configured to impart a beam of radiation with a pattern in its cross-section;
    a substrate table configured to hold a substrate;
    a projection system configured to project the patterned beam onto a target portion of the substrate; and
    a lithographic apparatus control system with an interface configured to communicate with the track control unit of the tack, the lithographic apparatus control system configured to retort a measurement or fault detected with respect to a substrate to the track control unit via the interface for control of rework of the substrate by the track.

12. The apparatus according to claim 11, wherein the lithographic apparatus control system is configured to control a movement of the substrate table, the patterning device, or both, to follow a trajectory and is configured to report a fault to control rework if the movement of the substrate table, the patterning device, or both, deviates significantly from the trajectory.

13. The apparatus according to claim 11, further comprising a focus/level sensor configured to measure a surface contour of the substrate and wherein the lithographic control system is configured to report a measurement to control rework if the surface contour exceeds a certain unevenness.

14. A track for use with a lithographic apparatus the track comprising:
    one or more processing devices configured to process one or more substrates;
    a metrology station;
    a rework station configured to rework a substrate; and
    a track control unit provided with an interface configured to communicate with a lithographic apparatus control system of the lithographic apparatus, the track control unit configured to control the rework station to rework a substrate based on a measurement or fault detected other than at the metrology station of the track.

15. The track according to claim 14, wherein the rework station comprises a wet chemical device including a dispenser configured to dispense a solvent, a rinse, or both, onto the substrate.

16. The track according to claim 14, wherein the rework station comprised a mechanical polisher.

17. The tack according to claim 14, wherein the rework station comprises a developer configured to be controlled by the track control unit to overdevelop the resist.

18. The track according to claim 14, further comprising a metrology device configured to detect one or more faults in a substrate exposed or processed in the lithographic processing cell.

19. A device manufacturing method, comprising:

exposing a substrate of a lot the lot comprising a plurality of substrates, to a pattern using a lithographic projection apparatus in a lithographic processing cell, processing the substrate using a track, having a metrology station, in the lithographic processing cell, or both exposing and processing;

measuring or detecting a fault, other than at the metrology station of the track, with respect to the substrate in the lithographic processing cell;

stripping resist from the exposed substrate using a rework station in the lithographic processing cell if a fault has been detected or measured with respect to the substrate;

re-coating with resist the stripped substrate; and re-exposing the re-coated substrate using the lithographic apparatus without the re-coated substrate leaving the lithographic processing cell.

20. The method according to claim 19, further comprising: holding one or more correctly processed substrates of the lot in the lithographic processing cell; and merging the re-exposed substrate back into the lot for subsequent treatment together with the one or more correctly processed substrates.

21. The method according to claim 19, further comprising: creating a new lot for the stripped substrate; and processing the new lot directly after the lot from which the stripped substrate derives or later in a sequence of lots.

22. The method according to claim 19, wherein exposing the substrate and measuring or detecting a fault are carried out for a plurality of lots using a same recipe and further comprising combining the stripped substrate with one or more substrates, either stripped or not from another of the plurality of lots to form a new lot.

* * * * *